(12) United States Patent
Jin

(10) Patent No.: US 9,570,148 B2
(45) Date of Patent: Feb. 14, 2017

(54) INTERNAL VOLTAGE GENERATION CIRCUIT, SEMICONDUCTOR MEMORY DEVICE AND SEMICONDUCTOR MEMORY SYSTEM

(71) Applicant: SK hynix Inc., Gyeonggi-do (KR)

(72) Inventor: Hyun-Jong Jin, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 175 days.

(21) Appl. No.: 14/326,123

(22) Filed: Jul. 8, 2014

(65) Prior Publication Data

US 2015/0228326 A1    Aug. 13, 2015

(30) Foreign Application Priority Data

Feb. 12, 2014    (KR) .................. 10-2014-0016117

(51) Int. Cl.
G11C 7/04        (2006.01)
G11C 11/4074     (2006.01)
G11C 16/04       (2006.01)
G11C 16/24       (2006.01)
G11C 16/26       (2006.01)

(52) U.S. Cl.
CPC ............ *G11C 11/4074* (2013.01); *G11C 7/04* (2013.01); *G11C 16/0483* (2013.01); *G11C 16/24* (2013.01); *G11C 16/26* (2013.01)

(58) Field of Classification Search
CPC ............ G11C 11/4074; G11C 11/4093; G11C 11/0483; G11C 16/26; G11C 16/24; G11C 7/04

See application file for complete search history.

(56) References Cited

U.S. PATENT DOCUMENTS

| 2005/0036369 A1* | 2/2005 | Lee ................... G11C 16/0483 |
| | | 365/185.18 |
| 2007/0008779 A1* | 1/2007 | Isobe ................... G11C 5/147 |
| | | 365/185.18 |
| 2008/0192536 A1* | 8/2008 | Lee ......................... G11C 7/12 |
| | | 365/185.2 |
| 2009/0290432 A1* | 11/2009 | Park ...................... G11C 16/26 |
| | | 365/185.25 |
| 2012/0126735 A1* | 5/2012 | Ueda ...................... H02M 1/38 |
| | | 318/400.27 |
| 2012/0230103 A1* | 9/2012 | Choe .................. G11C 16/0483 |
| | | 365/185.2 |
| 2013/0194872 A1* | 8/2013 | Sim ........................ G11C 16/26 |
| | | 365/185.17 |

FOREIGN PATENT DOCUMENTS

KR    1020100060933    6/2010

* cited by examiner

*Primary Examiner* — Douglas King
(74) *Attorney, Agent, or Firm* — IP & T Group LLP

(57) ABSTRACT

An internal voltage generation circuit includes a charging unit suitable for charging electrical charges for a time corresponding to a control signal; a charge control unit suitable for generating the control signal, which is activated for a time corresponding to temperature information, and controlling a charging operation of the charging unit; and an output unit suitable for generating an internal voltage based on charge amount by the charging operation.

7 Claims, 4 Drawing Sheets

INTERNAL VOLTAGE GENERATION CIRCUIT, SEMICONDUCTOR MEMORY DEVICE AND SEMICONDUCTOR MEMORY SYSTEM

CROSS-REFERENCE TO RELATED APPLICATIONS

The present application claims priority of Korean Patent Application No. 10-2014-0016117, filed on Feb. 12, 2014, which is incorporated herein by reference in its entirety.

BACKGROUND

1. Field

Exemplary embodiments of the present invention relate to a semiconductor design technology, and, more particularly, to an internal voltage generation circuit for generating an internal voltage that is temperature dependent.

2. Description of the Related Art

Generally, a semiconductor device such as a double data rate synchronous dynamic random access memory (DDR SDRAM) receives a power supply voltage from an external controller to generate an internal voltage used for various purposes. There are generally two methods for generating the internal voltage. One method generates the internal voltage by down-converting the power supply voltage, and the other method generates the internal voltage by pumping the power supply voltage.

Circuit size continues to decrease, and speed continues to increase as semiconductor technology develops. As integration and speed increase, the voltage level used in the circuit operation has to be lowered. Accordingly, technologies for stably generating, maintaining, and controlling low voltage levels are being studied at the present time.

The above technologies include research on circuits that generate an internal voltage that is dependent on temperature. Circuits that generate a temperature dependent internal voltage are generally designed by combining a circuit having a proportional to absolute temperature (PTAT) current characteristic and a circuit having a complementary to absolute temperature (CTAT) current characteristic. The PTAT current characteristic has a relationship where temperature is proportional to current, which means current increases as the temperature increases. The CTAT current characteristic has a relationship where temperature is inversely proportional to current, which means current decreases as temperature increases.

Circuits that generate a temperature dependent voltage are generally designed with a strong CTAT function and are sensitive to temperature, i.e. have large variations in voltage relative to temperature variation. However, to enlarge the CTAT current characteristic of the circuit, the current consumed in the circuit has to increase, and this causes a concern where the current consumed in the circuit exceeds a target current when the circuit operates.

SUMMARY

Various exemplary embodiments of the present invention are directed to an internal voltage generation circuit for generating a temperature dependent voltage.

In accordance with an exemplary embodiment of the present invention, an internal voltage generation circuit may include a charging unit suitable for charging electrical charges for a time corresponding to a control signal, a charge control unit suitable for generating the control signal, which is activated for a time corresponding to temperature information, and controlling a charging operation of the charging unit; and an output unit suitable for generating an internal voltage based on the charge generated in the charging operation.

The time for the charging operation of the charging unit may vary based on the temperature information.

In accordance with another exemplary embodiment of the present invention, a semiconductor memory device may include a bit line suitable for transferring data stored in a memory cell, a current control unit suitable for controlling the amount of current flowing through the bit line in response to a bit line control voltage, a voltage generation unit suitable for generating a pre-sensing voltage by a charging operation for a time corresponding to temperature information during a pre-sensing operation section, a selection output unit suitable for outputting the pre-sensing voltage as the bit line control voltage during the pre-sensing operation section, and a page buffering unit suitable for sensing and outputting the data transferred through the bit line during a main sensing operation section.

The selection output unit may selectively output the pre-sensing voltage and a main sensing voltage during the pre-sensing operation section and the main sensing operation section, respectively.

In accordance with still another exemplary embodiment of the present invention, a semiconductor memory system may include a semiconductor memory device suitable for outputting data through a read operation including a pre-sensing operation and a main sensing operation and a controller suitable for controlling entry timings of the pre-sensing operation and the main sensing operation in response to temperature information provided from the semiconductor memory device, wherein the semiconductor memory device includes a bit line suitable for transferring the data stored in a memory cell, a current control unit suitable for controlling current flowing through the bit line in response to a bit line control voltage, a voltage generation unit suitable for generating a pre-sensing voltage by a charging operation for a time corresponding to the temperature information during a pre-sensing operation section, a selection output unit suitable for outputting the pre-sensing voltage as the bit line control voltage during the pre-sensing operation section, and a page buffering unit suitable for sensing and outputting the data transferred through the bit line during a main sensing operation section.

The controller may delay the entry timing of the pre-sensing operation in response to the temperature information when the pre-sensing voltage increases and may advance the entry timing of the pre-sensing operation in response to the temperature information when the pre-sensing voltage decreases.

According to the internal voltage generation circuit of the embodiments, it is possible to generate an internal voltage having a voltage level corresponding to temperature information regardless of PTAT and CTAT current characteristics.

DETAILED DESCRIPTION

Figure 1:
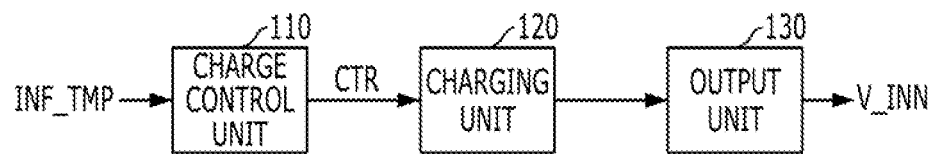
FIG. 1 is block diagram illustrating an internal voltage generation circuit in accordance with an exemplary embodiment of the present invention.

Exemplary embodiments of the present invention will be described below in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. The drawings are not necessarily to scale, and, in some instances, proportions may have been exaggerated to clearly illustrate features of the embodiments. Throughout the disclosure, reference numerals correspond directly to the like numbered parts in the various figures and embodiments of the present invention. It is also noted that, in this specification, "connected/coupled" refers to one component not only directly coupling another component but also indirectly coupling another component through an intermediate component. In addition, a singular form may include a plural form, and vice versa, as long as it is not specifically mentioned.

FIG. 1 is block diagram illustrating an internal voltage generation circuit in accordance with an exemplary embodiment of the present invention.

Referring to FIG. 1, the internal voltage generation circuit includes a charge control unit 110, a charging unit 120, and an output unit 130.

The charge control unit 110 generates a control signal CTR, which is activated for a time corresponding to temperature information INF_TMP, and the charge control unit 110 controls a charging operation of the charging unit 120. The temperature information INF_TMP is a signal that reflects temperature. For example, the control signal CTR may have a pulse width corresponding to the temperature information INF_TMP, and, therefore, the pulse width of the control signal CTR may vary according to a temperature.

The charging unit 120 may charge electrical charges for a time corresponding to the control signal CTR and may perform the charging operation for a time corresponding to the pulse width of the control signal CTR. As described above, the control signal CTR has a pulse width corresponding to the temperature information INF_TMP, and thus the charging unit 120 may perform the charging operation for a time corresponding to the temperature information INF_TMP. This means that the time for the charging operation may differ according to temperature.

The output unit 130 generates an internal voltage V_INN based on the charge generated by the charging operation of the charging unit 120. The internal voltage V_INN has a voltage level corresponding to the charge amount.

The internal voltage generation circuit in accordance with the exemplary embodiment of the present invention may generate the internal voltage V_INN by controlling the charging time of the charging unit 120 based on the temperature information INF_TMP.

Figure 2:
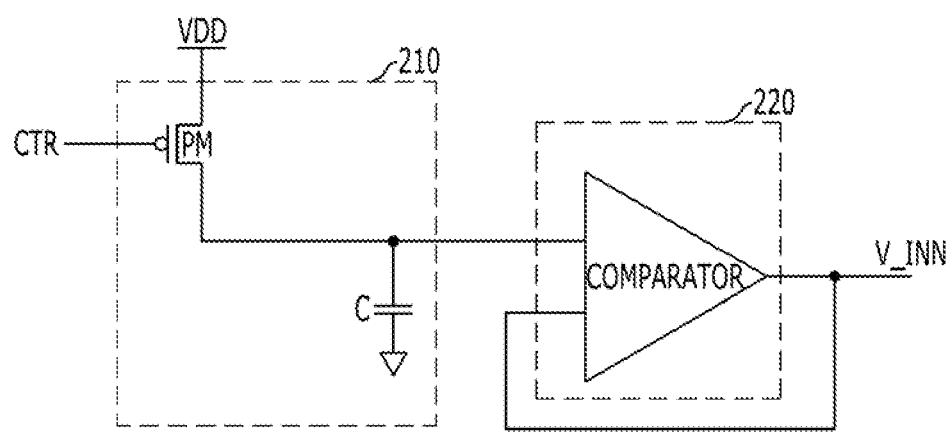
FIG. 2 is a circuit diagram illustrating a charging unit and an output unit shown in FIG. 1.

FIG. 2 is a circuit diagram illustrating the charging unit 120 and the output unit 130 shown in FIG. 1. In FIG. 2, the reference numeral "210" corresponds to the charging unit 120 of FIG. 1, and the reference numeral "220" corresponds to the output unit 130 of FIG. 1. For convenience of description, the reference numeral "220" is referred to as a comparison unit.

Referring to FIG. 2, the charging unit 210 includes a PMOS transistor PM and a capacitor C. The PMOS transistor PM transfers a supply voltage VDD in response to the control signal CTR, and the capacitor C is charged with current passing through the PMOS transistor PM. The comparison unit 220 generates the internal voltage V_INN based on a voltage level (hereinafter, referring to as a "reference voltage level") of the electrical charge in the capacitor C. The comparison unit 220 includes a comparator for generating the internal voltage V_INN by comparing the reference voltage level with the internal voltage V_INN, which is fed back from an output terminal.

An operation of the charging unit 210 and the comparison unit 220 will now be explained in detail. For convenience of description, it is assumed that the control signal CTR has a broader pulse width at a relatively high temperature and a narrower pulse width at a relatively low temperature.

First, where the control signal CTR has a broader pulse width, the charging time of the capacitor C increases in response to the broader pulse width, and thus the reference voltage level increases. As a result, the internal voltage V_INN increases until it reaches a voltage level corresponding to the reference voltage level.

Next, in the case where the control signal CTR has a narrower pulse width, the charging time of the capacitor C decreases in response to the narrower pulse width, and thus the reference voltage level decreases in comparison to where the control signal CTR has a broader pulse width. As a result, the internal voltage V_INN decreases.

The internal voltage generation circuit, in accordance with the exemplary embodiment of the present invention, may change the charging time according to temperature, and thus it is possible to control the internal voltage V_INN.

Figure 3:
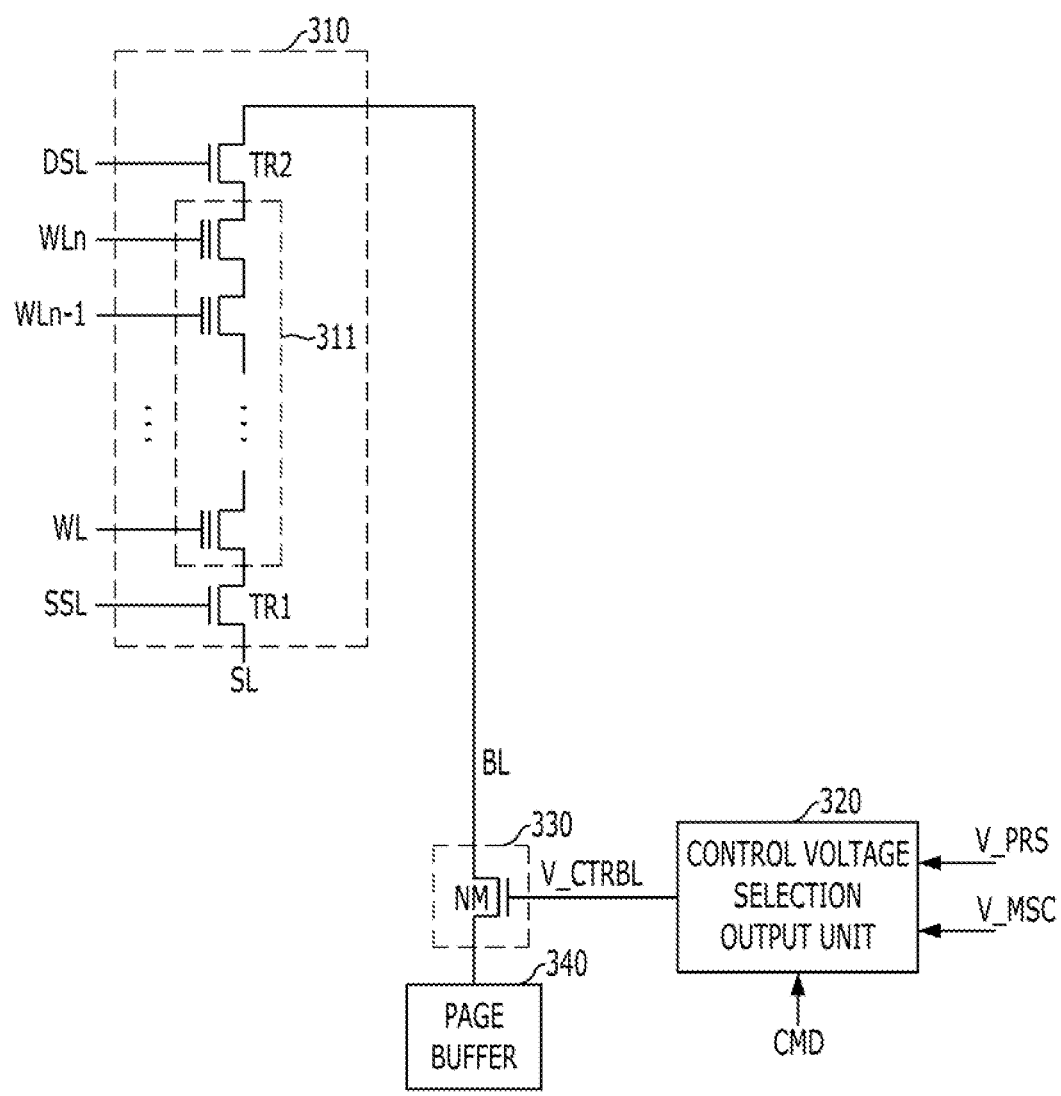
FIG. 3 is a block diagram illustrating a semiconductor memory device in accordance with an exemplary embodiment of the present invention.

FIG. 3 is a block diagram illustrating a semiconductor memory device in accordance with an exemplary embodiment of the present invention.

Referring to FIG. 3, the semiconductor memory device includes a memory cell array 310, a control voltage selection output unit 320, a current control unit 330, and a page buffer 340.

The memory cell array 310 includes a memory cell 311, a first transistor TR1, and a second transistor TR2. The memory cell 311 is coupled to a plurality of word lines WL1, WL2, . . . , WLn, n being a natural number. The first transistor TR1 couples the memory cell 311 to a source line SL in response to a source selection signal SSL. The second transistor TR2 couples the memory cell 311 to a bit line BL in response to a drain selection signal DSL.

The control voltage selection output unit 320 outputs a bit line control voltage V_CTRBL in response to a command signal CMD. In detail, the control voltage selection output unit 320 outputs a pre-sensing voltage V_PRS as the bit line control voltage V_CTRBL during a pre-sensing operation section and outputs a main sensing voltage V_MSC as the bit line control voltage V_CTRBL during a main sensing operation section. Here, the pre-sensing operation section and the main sensing operation section may be defined by the command signal CMD, and the pre-sensing operation section may be defined as a section prior to the main sensing operation section. The pre-sensing voltage V_PRS is generated by a charging operation according to a temperature. A detailed description regarding the pre-sensing voltage V_PRS is explained with reference to FIG. 4.

The current control unit 330 controls current flowing through the bit line BL in response to the bit line control voltage V_CTRBL. The current control unit 330 includes an NMOS transistor NM, which has a drain-source path coupled between the bit line BL and the page buffer 340, and a gate receiving the bit line control voltage V_CTRBL. The current control unit 330 controls the current flowing through the bit line BL by receiving the pre-sensing voltage V_PRS during the pre-sensing operation section and controls the current amount flowing through the bit line BL by receiving the main sensing voltage V_MSC during the main sensing operation section.

The page buffer 340 senses and outputs data transferred through the bit line BL.

The semiconductor memory device, in accordance with the exemplary embodiment of the present invention, may control the pre-sensing operation section using the pre-sensing voltage V_PRS that is dependent on temperature, and thus it is possible to control the current flowing through the bit line BL in response to temperature.

Figure 4:
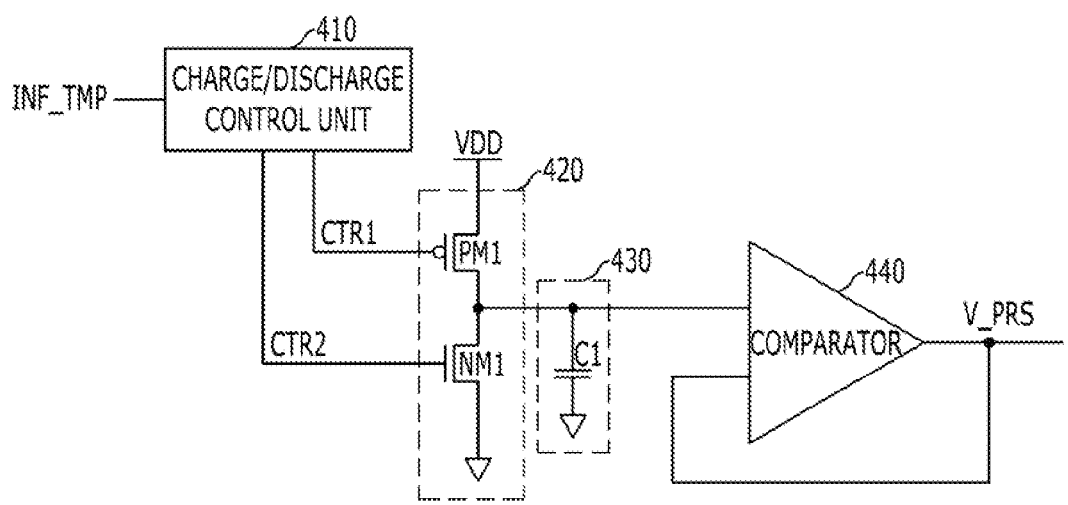
FIG. 4 is a detailed circuit diagram illustrating a pre-sensing voltage generation circuit for generating a pre-sensing voltage shown in FIG. 3.

FIG. 4 is a detailed circuit diagram illustrating a pre-sensing voltage generation circuit for generating the pre-sensing voltage V_PRS shown in FIG. 3.

Referring to FIG. 4, the pre-sensing voltage generation circuit includes a charge/discharge control unit 410, a charge/discharge driving unit 420, a charging unit 430, and a comparison unit 440.

The charge/discharge control unit 410 generates first and second control signals CTR1 and CTR2 in response to temperature information INF_TMP. The first control signal CTR1 controls a charging operation of the charging unit 430 while the second control signal CTR2 controls a discharging operation of the charging unit 430. Here, the first control signal CTR1 may have a pulse width corresponding to the temperature information INF_TMP, which means that the pulse width of the first control signal CTR1 may differ according to the temperature.

The charge/discharge driving unit 420 provides a supply voltage VDD to the charging unit 430 in response to the first control signal CTR1 and discharges the charging unit 430 to a ground voltage VSS in response to the second control signal CTR2. The charge/discharge driving unit 420 includes a PMOS transistor PM1 and an NMOS transistor NM1. The PMOS transistor PM1 is turned on in response to the first control signal CTRL and the NMOS transistor NM1 is turned on in response to the second control signal CTR2.

The charging unit 430 charges or discharges in response to a charge/discharge operation of the charge/discharge driving unit 420. The charging unit 430 includes a capacitor C1.

The comparison unit 440 generates the pre-sensing voltage V_PRS based on the voltage level (hereinafter, referring to as a "reference voltage level") of the charge stored in the capacitor C1. The comparison unit 440 includes a comparator for generating a pre-sensing voltage V_PRS by comparing the reference voltage level with the pre-sensing voltage V_PRS, which is fed back from an output terminal.

Hereinafter, an operation of the pre-sensing voltage generation circuit will be explained in detail. For convenience of description, it is assumed that the first control signal CTR1 has a broader pulse width at a relatively high temperature and has a narrower pulse width at a relatively low temperature.

First, where the first control signal CTR1 has a broader pulse width at a relatively high temperature, the PMOS transistor PM1 is turned on in response to the first control signal CTR1. The capacitor C1 performs a charging operation in response to the broader pulse width of the first control signal CTR1. As a result, the pre-sensing voltage V_PRS level increases.

Next, where the control signal CTR has a narrower pulse width at a relatively low temperature, the PMOS transistor PM1 is turned on in response to the first control signal PM1. However, in this instance, since the capacitor C1 performs the charging operation in response to a narrower pulse width of the first control signal CTRL the pre-sensing voltage V_PRS level is lower in comparison with the previous case where the temperature was relatively high.

Meanwhile, the second control signal CTR2 controls the discharging operation of the charging unit 430. When the second control signal CTR2 is activated, the NMOS transistor NM1 is turned on and the electrical charge in the capacitor C1 is discharged.

Referring back to FIGS. 3 and 4, a read operation of the semiconductor memory device will be explained in detail. For reference, the semiconductor memory device stores data in the memory cell 311 through a write operation, and then the semiconductor memory device outputs the data stored in the memory cell 311 through the read operation. The read operation is a series of operations including a pre-sensing operation and a main sensing operation.

First, during the pre-sensing operation section, the current control unit 330 receives the pre-sensing voltage V_PRS and controls the current amount flowing through the bit line BL in response to the pre-sensing voltage V_PRS. As described above, the pre-sensing voltage V_PRS has a voltage level corresponding to the temperature information INF_TMP, and thus the current flowing through the bit line BL is controlled by the temperature information INF_TMP.

Subsequently, during the main sensing operation section, the current control unit 330 receives the main sensing voltage V_MSC, and the page buffer 340 senses and outputs the data transferred through the bit line BL.

The semiconductor memory device, in accordance with the exemplary embodiment of the present invention, may generate the pre-sensing voltage V_PRS through the charging operation according to the temperature information INF_TMP, and thus it is possible to control the current flowing through the bit line BL in response to the pre-sensing voltage V_PRS during a pre-sensing operation.

Figure 5:
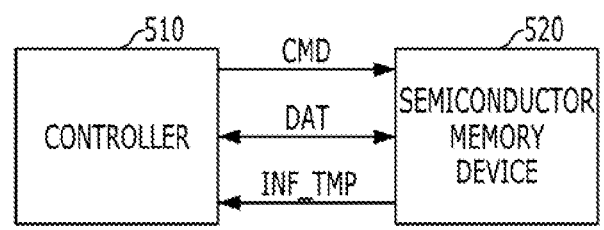
FIG. 5 is a block diagram illustrating a semiconductor memory system in accordance with an exemplary embodiment of the present invention.

FIG. 5 is a block diagram illustrating a semiconductor memory system in accordance with an exemplary embodiment of the present invention.

Referring to FIG. 5, the semiconductor memory system includes a controller 510 and a semiconductor memory device 520.

The controller 510 generates a command signal CMD for controlling the semiconductor memory device 520. The semiconductor memory device 520 outputs or receives data DAT to/from the controller 510 in response to the command signal CMD. The command signal CMD may be used to set a write operation, a read operation, and the like. Accordingly, the controller 510 transmits the data DAT to the semiconductor memory device 520 during the write operation and receives the data DAT from the semiconductor memory device 520 during the read operation. The semiconductor memory device 520 performs the read operation and the write operation under the control of the controller 510 and may include the components shown in FIGS. 3 and 4.

Meanwhile the controller 510 controls entry timings of a pre-sensing operation and a main sensing operation in response to temperature information INF_TMP provided from the semiconductor memory device 520. As described above, the read operation is a series of operations including a pre-sensing operation and a main sensing operation. A detailed description regarding the read operation is explained with reference to FIG. 6.

The semiconductor memory system, in accordance with the exemplary embodiment of the present invention, may control activation timing of the command signal CMD for setting the pre-sensing operation and the main sensing operation in response to the temperature information INF_TMP.

Figure 6:
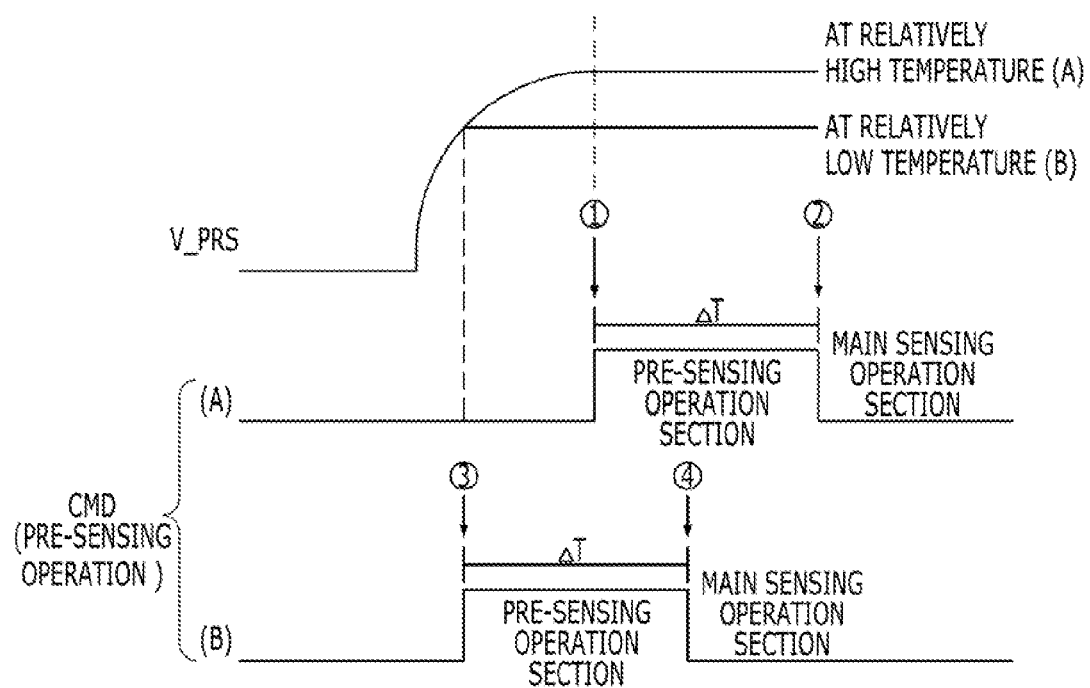
FIG. 6 is a timing diagram illustrating an operation of the semiconductor memory system shown in FIG. 5.

FIG. 6 is a timing diagram illustrating an operation of the semiconductor memory system shown in FIG. 5. For convenience of description, it is assumed that the pre-sensing voltage V_PRS level increases at a relatively high temperature (A) and decreases at a relatively low temperature (B).

Referring to FIG. 6, in case of a relatively high temperature (A), the charge operation time is long, and the pre-sensing voltage V_PRS level increases. Accordingly, the pre-sensing operation starts at time ①, and the main sensing operation starts at time ② after a predetermined time ΔT from time ①. Here, the predetermined time ΔT is the time required for the pre-sensing operation. For convenience of description, it is assumed that the predetermined time ΔT is applied to the cases of both the relatively high temperature (A) and the relatively low temperature (B) in FIG. 6.

Next, in case of the relatively low temperature (B), the charge operation time is short, and the voltage level of the pre-sensing voltage V_PRS decreases. Accordingly, the pre-sensing operation starts at time ③, before time ①, and the main sensing operation starts at time ④, after the predetermined time ΔT from time ③.

In other words, when the pre-sensing voltage V_PRS increases, the controller 510 may delay the entry timing of the pre-sensing operation in response to the temperature information INF_TMP provided from the semiconductor memory device 520; on the contrary, when the pre-sensing voltage V_PRS decreases, the controller 510 may advance the entry timing of the pre-sensing operation in response to the temperature information INF_TMP provided from the semiconductor memory device 520.

The semiconductor memory system, in accordance with the exemplary embodiment of the present invention, may control entry timings of the pre-sensing operation and the main sensing operation in response to the temperature information INF_TMP. That is, the semiconductor memory system may control the read operation speed according to the temperature, and this means that it is possible to optimize the speed of the read operation according to the temperature.

As described above, the internal voltage generation circuit in accordance with the exemplary embodiment of the present invention may stably generate an internal voltage based on temperature information.

While the present invention has been described with respect to the specific embodiments, it will be apparent to those skilled in the art that various changes and modifications may be made without departing from the spirit and scope of the invention as defined in the following claims.

For instance, positions and types of the logic gates and transistors exemplified in the above-described embodiment can be realized differently according to the polarities of the signals inputted thereto.

What is claimed is:

1. A semiconductor memory device comprising:
   a bit line configured to transfer data stored in a memory cell;
   a current control unit configured to control current flowing through the bit line in response to a bit line control voltage;
   a voltage generation unit configured to generate a pre-sensing voltage by a charging operation for a time corresponding to temperature information during a pre-sensing operation section;
   a selection output unit configured to output the pre-sensing voltage as the bit line control voltage during the pre-sensing operation section; and
   a page buffering unit configured to sense and output the data transferred through the bit line during a main sensing operation section,
   wherein the entry timing of the pre-sensing operation is delayed in response to the temperature information when the pre-sensing voltage increases; and the entry timing of the pre-sensing operation is advanced in response to the temperature information when the pre-sensing voltage decreases.

2. The semiconductor memory device of claim 1, wherein the selection output unit selectively outputs the pre-sensing voltage and a main sensing voltage during the pre-sensing operation section and the main sensing operation section, respectively.

3. The semiconductor memory device of claim 1, wherein the pre-sensing voltage has a voltage level that varies based on the temperature information.

4. The semiconductor memory device of claim 1, wherein the voltage generation unit comprises:
   a charge driving unit configured to supply a supply voltage for a time corresponding to the temperature information;
   a charging unit configured to charge the supply voltage supplied from the charge driving unit; and
   an output unit configured to generate the pre-sensing voltage corresponding to a reference voltage level defined by the charging unit.

5. The semiconductor memory device of claim 4, further comprising:
   a discharge driving unit configured to discharge electrical charges, which are charged in the charging unit, to a ground voltage.

6. A semiconductor memory system comprising:
   a semiconductor memory device configured to output data through a read operation including a pre-sensing operation and a main sensing operation; and
   a controller configured to control entry timings of the pre-sensing operation and the main sensing operation in response to temperature information provided from the semiconductor memory device,
   wherein the semiconductor memory device comprises:
   a bit line configured to transfer the data stored in a memory cell;
   a current control unit configured to control current flowing through the bit line in response to a bit line control voltage;
   a voltage generation unit configured to control a pre-sensing voltage by a charging operation for a time corresponding to the temperature information during a pre-sensing operation section;
   a selection output unit configured to output the pre-sensing voltage as the bit line control voltage during the pre-sensing operation section; and
   a page buffering unit configured to sense and outputting the data transferred through the bit line during a main sensing operation section, wherein the controller delays the entry timing of the pre-sensing operation in response to the temperature information when the pre-sensing voltage increases; and advances the entry timing of the pre-sensing operation in response to the temperature information when the pre-sensing voltage decreases.

7. The semiconductor memory system of claim 6, wherein the pre-sensing operation is performed for a given time, and the main sensing operation is performed after the pre-sensing operation.

\* \* \* \* \*